United States Patent
Ohtani et al.

(10) Patent No.: US 6,979,632 B1
(45) Date of Patent: *Dec. 27, 2005

(54) FABRICATION METHOD FOR THIN-FILM SEMICONDUCTOR

(75) Inventors: Hisashi Ohtani, Kanagawa (JP); Takeshi Fukunaga, Kanagawa (JP); Toru Mitsuki, Kanagawa (JP)

(73) Assignee: Semiconductor Energy Laboratory Co., Ltd., Atsugi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/678,591

(22) Filed: Jul. 11, 1996

(30) Foreign Application Priority Data

Jul. 13, 1995 (JP) .............................. 7-200356

(51) Int. Cl.⁷ .............................................. H01L 21/20
(52) U.S. Cl. ...................... 438/487; 438/745; 438/798; 438/149
(58) Field of Search ................................ 438/149, 487, 438/692, 697, 719, 723, 753, 756, 751, 795–799, 974, 482, 964, 977, 704, 484, 438

(56) References Cited

U.S. PATENT DOCUMENTS

| | | | |
|---|---|---|---|
| 4,992,846 A | * | 2/1991 | Sakakibara et al. |
| 5,260,232 A | * | 11/1993 | Muroyama et al. |
| 5,320,708 A | * | 6/1994 | Kadomura et al. |
| 5,437,762 A | * | 8/1995 | Ochiai et al. |
| 5,496,764 A | * | 3/1996 | Sun ............................ 438/164 |
| 5,585,661 A | * | 12/1996 | McLachlan et al. |
| 5,641,380 A | * | 6/1997 | Yamazaki et al. .......... 438/304 |
| 5,747,385 A | * | 5/1998 | Torii |
| 5,786,242 A | * | 7/1998 | Takemura et al. .......... 438/166 |
| 5,851,861 A | * | 12/1998 | Suzawa et al. ............. 438/166 |
| 5,891,763 A | * | 4/1999 | Wanlass ..................... 438/164 |
| 6,489,241 B1 | * | 12/2002 | Thilderkvist et al. ....... 438/689 |

FOREIGN PATENT DOCUMENTS

| | | |
|---|---|---|
| JP | 52-131471 | 11/1977 |
| JP | 61-216329 | 9/1986 |

(Continued)

OTHER PUBLICATIONS

Takahashi, et al., "Oxide–semiconductor interface roughness and electrical properties of polycrystalline silicon thin–film transistors", Appl. Phys. Lett., vol. 64, No. 17, pp. 2273–2275, Apr. 25, 1994.

(Continued)

*Primary Examiner*—Savitri Mulpuri
(74) *Attorney, Agent, or Firm*—Fish & Richardson P.C.

(57) ABSTRACT

The present invention has as its object to provide a technique of forming a surface of a thin-film semiconductor having corrugations and smoothing the same. This is achieved by a fabrication method for thin-film semiconductors which smooths a surface of a silicon film having corrugations, comprising the steps of forming an oxidized silicon film on the surface of the silicon film, removing the oxidized silicon film which has been formed in protruding portions among the corrugations and exposing at least part of protruding portions in the silicon film, and removing the protrusions in the silicon film exposed in the previous step. In the above structure, the silicon film having corrugations has an average thickness of about 100 Å to 1000 Å (e.g. an amorphous silicon film or a crystalline silicon film crystallized by thermal processing) which is irradiated by a laser beam and crystallized or a silicon layer promoting crystallization.

49 Claims, 8 Drawing Sheets

FOREIGN PATENT DOCUMENTS

| | | | |
|---|---|---|---|
| JP | 63-161620 | | 7/1988 |
| JP | 01-027242 | | 1/1989 |
| JP | 01-270313 | | 10/1989 |
| JP | 03-099421 | | 4/1991 |
| JP | 04-119631 | | 4/1992 |
| JP | 04-180624 | | 6/1992 |
| JP | 8153875 | * | 6/1996 |
| JP | 08-255916 | | 10/1996 |

OTHER PUBLICATIONS

Cao, et al., "A Low Thermal Budget Polysilicon Thin Film Using Chemical Mechanical Polishing", Supported by the ARPA grant MDA 972–92–J–1001, Center for Integrated Systems, Stanford University, Stanford, CA 94305, pp. 294–297.

* cited by examiner

THERMAL PROCESSING

LASER BEAM RADIATION

ION IMPURITY INJECTION AND LASER BEAM RADIATION

FABRICATION METHOD FOR THIN-FILM SEMICONDUCTOR

BACKGROUND OF THE INVENTION

The invention disclosed in this specification relates to a fabrication method for a thin-film semiconductor utilized in devices using thin-film semiconductors (for example, thin-film transistors, photo-electric conversion devices, etc.).

In recent years liquid crystal display devices utilizing thin-film transistors have become well-known. These are known as active matrix type devices, and have thin-film transistors respectively arranged in each pixel disposed in a matrix shape, these thin-film transistors controlling input and output of charges maintained in the pixel electrode of each pixel. These types of active matrix liquid crystal display devices are compact and light-weight, and in addition since they can display a high speed picture in minute detail, are expected to become the main force in future display devices.

Thin-film transistors which are utilized in active-matrix liquid crystal display devices require to be formed on the surface of a substrate having translucence. This is because light is required to pass through the substrate forming the liquid crystal display.

As a substrate having translucence, a glass or quartz substrate, or even a plastic substrate may be cited. In forming a thin-film semiconductor, since heating must be performed to a certain extent, utilizing a plastic substrate is inappropriate. Also, since a quartz substrate can withstand high temperatures in the order of 1000° C., it is appropriate as a substrate for forming a thin-film semiconductor, although it is generally unsuitable due to its high cost (in particular, over a large area it can be ten times the cost of a glass substrate or more).

Consequently, a glass substrate is generally used, the thin-film semiconductor being formed on the surface of this glass substrate. Currently, as a thin-film semiconductor, an amorphous silicon film is generally used. The amorphous silicon film can be formed by a plasma CVD method and heated to about 200 to 400° C., therefore a low-cost glass substrate can be utilized.

Also, where fabricating a thin-film transistor using an amorphous silicon film, there is the problem that the characteristics thereof are low. Accordingly, in order to achieve an active matrix liquid crystal display device having a display characteristic which is more effective than that obtainable under current circumstances, a thin-film transistor having an even higher characteristic is necessary.

In attaining a thin-film transistor having an even higher characteristic than a thin-film transistor using an amorphous silicon film a crystalline silicon film may be used as the thin-film semiconductor. A crystalline silicon film can be achieved by thermal processing of an amorphous silicon film. However, in such a case the following problems occur. Namely, although generally the withstand temperature of a glass substrate is 600° C. or less, crystallization of an amorphous silicon film requires temperatures of 600° C. and more. Thus techniques of performing thermal processing at a temperature of around 600° C. to crystallize an amorphous silicon film formed on a glass substrate are currently being researched. However, where crystallizing an amorphous silicon film at a temperature of about 600° C., it is necessary to perform thermal processing for some tens of hours or more (generally 24 hours or more), therefore there is the problem that practicality and productivity are extremely low.

As a technique for solving this problem, there is a technique of deforming the amorphous silicon film into a crystalline silicon film by irradiating it with a laser beam. Since irradiation by laser beam does not incur thermal damage to the lower level (base) glass substrate, the problem of thermal resistance of the glass substrate accompanying a method using thermal processing does not occur.

However, where an amorphous silicon film of about 1000 Å or less is irradiated by a laser beam, it is clear that corrugations form in the surface of the crystalline silicon film thus obtained. This tendency is particularly strong where the amorphous silicon film, which is the starting film, is thin at 1000 Å or less. Alternatively, from the problem of laser beam absorption the result that the thinner the film thickness (particularly 500 Å or less) of the amorphous silicon film which is the starting film the more favorable for crystallization.

Namely, where the thickness of the amorphous silicon film which is the starting film is made thin in order to facilitate crystallization, there exists the dilemma that the surface of the thus-obtained crystalline silicon film will have large corrugations.

FIG. 2 shows the state of the surface of an amorphous silicon film obtained by irradiating an amorphous silicon film of 500 Å thickness formed on a glass substrate with a laser beam. FIG. 2 is a photograph taken when observing the surface of the amorphous silicon film with an atomic microscope.

Where a thin-film transistor is fabricated using a thin-film semiconductor, the state of the surface of the thin-film semiconductor is extremely important. This is because carriers are conducted in the surface of the thin-film semiconductor. If corrugations exist in the surface of the thin-film semiconductor, potential barriers, traps, etc. exist which give rise to disconnection or warping of the lattice, the moving carrier being dispersed, trapped, etc.

Also, where a thin-film transistor is fabricated using a thin-film semiconductor, although it is necessary to form a gate insulation film or other insulation film in contact with the thin-film semiconductor, if corrugations exist in the surface of the thin-film semiconductor step coverage of the insulation film is unsatisfactory, causing unfavorable insulation and instability. In addition, the corrugations in the surface of the thin-film semiconductor as described above become hindrances to fabrication of thin-film diodes, photo-electric conversion devices, etc. Consequently, it is preferable that the surface of the thin-film semiconductor be as smooth as possible.

SUMMARY OF THE INVENTION

The invention disclosed in this specification has as its object to provide a technique of forming a surface of a thin-film semiconductor having depressions and protrusions and smoothing the same.

One of the main inventions disclosed in this specification is a fabrication method for thin-film semiconductors which smooths a surface of a silicon film having depressions and protrusions, comprising the steps of forming an oxidized silicon film on the surface of the silicon film, removing the oxidized silicon film which has been formed in protruding portions among the depressions and protrusions and exposing at least part of protruding portions in the silicon film, and removing the protrusions in the silicon film exposed in the previous step. In the above structure, as the silicon film having depressions and protrusions, an example can be given of a silicon film having an average thickness of about 1000 Å or less (e.g. an amorphous silicon film or a crystalline silicon film crystallized by thermal processing) which is irradiated by a laser beam and crystallized or a silicon layer promoting crystallization. Note that in practice a silicon film with an average thickness of 100 Å or more is preferable.

Where the silicon film with an average thickness of 1000 Å or less is irradiated with a laser beam (e.g. an excimer laser having a wavelength of infra-red light or less) a crystalline silicon film with extremely favorable crystallization can be obtained. However, on the other hand as shown in FIG. 2 the surface thereof has large depressions and protrusions.

Upon irradiating the silicon film with a laser beam, the surface of the silicon film reaches an instantaneous molten state. Then when it is cooled and hardened instantaneous crystallization advances and a crystalline silicon film is formed.

Comparing a silicon film in a crystallized state and a silicon film in a solution state, the solution state silicon film has the greater density. Consequently, where advancing from an instantaneous molten state to crystalline state, local expansion occurs and as a result depressions and protrusions are formed in the surface thereof. However, looking at this from a different point of view, as a result of the formation of these depressions and protrusions, since internal stress caused by the crystallization is alleviated, it can be said that this results in obtaining a silicon film having favorable low internal stress crystallinity.

In this manner, by irradiating the silicon film with a laser beam, corrugations forming in the surface of the silicon film are an unavoidable phenomenon in order to obtain a favorable low internal stress crystalline silicon film. It is clear that this phenomenon also is particularly remarkable where a silicon film having a thickness of 1000 Å or less is irradiated with a laser beam.

Also, where a metal element is added to promote crystallization of the silicon in the laser irradiated silicon film, since crystallization proceeds very effectively from the molten state due to laser irradiation, the corrugations form even more remarkably.

As the metal for promoting crystallization, one type or a of types from among Fe, Co, Ni, Ru, Rh, Pd, Os, Ir, Pt, Cu and Au can be used. The element among these which can in particular achieve the most significant affect is nickel (Ni).

As the silicon film irradiated by laser beam, an amorphous silicon film, a crystalline silicon film crystallized by thermal processing, or a silicon film decrystallized by injection of ion impurities or the like may be cited. Also, as the silicon film irradiated by laser beam, an amorphous silicon film, using a material having a thickness of 1000 Å or less is one condition for obtaining favorable crystallinity. However, film thickness of 100 Å or less is generally not practical because it cannot maintain the state of a thin film.

In the invention disclosed in this specification, in order to remove the corrugations in the surface of the crystalline silicon film formed by laser irradiation as described above, the following steps are employed.

(1) Laminating an oxidized silicon film on the surface of the silicon film having corrugations.

(2) Removing the oxidized silicon film which has been formed in protruding portions among the corrugations and exposing at least a part of the protruding portions in the silicon film.

(3) Removing the exposed protruding portions in the silicon film.

Why oxidized silicon film is used in this series of steps is because its etching rate with silicon is extremely high with respect to a predetermined etchant. For example, where hydrazine is used as the etchant, although the silicon is easily removed by etching, the oxidized silicon is mostly not etched away.

Also, as a method of selectively etching the silicon, using halogen fluoride gas as indicated by $ClF_3$, $ClF$, $BrF_3$, $IF_3$, $BrF$, $BrFs$ and $IF_5$ is effective. Using $ClF_3$ is particularly effective.

In step (2), removing the oxidized silicon film which has been formed in protruding portions among the corrugations is to expose the protruding portions and remove only these exposed protruding portions in a subsequent step. A representative diagram showing a state where these protruding portions are exposed is given in FIG. 3(B). What is shown in FIG. 3 is a state where the oxidized silicon film 303 in the depressions indicated by 305 is left and the protruding portions indicated by 304 are exposed.

Then, in this state, by performing etching using an etchant which can selectively etch away only the silicon (e.g. hydrazine, $ClF_3$, etc.), the state shown in FIG. 4(A) can be attained. Then by performing an etching process using an etchant which can further selectively etch the oxidized silicon film 303 (e.g. a buffer hydrofluoric acid), a smoothed surface as shown in FIG. 4(B) can be attained. Here, if the thickness of the oxidized silicon film 303 is approximately 100 Å, a surface having corrugations with a height difference of 100 Å or less can be achieved as the smoothness of the surface of the attained silicon layer.

Here, although a case where an oxidized silicon film is used as the film indicated by 303 has been explained, a material which can selectively leave silicon in the predetermined etching step of another film such as silicon nitride or the like can be used.

Namely, a material having a masking property when etching the silicon can be used in place of the oxidized silicon film explained here. As this type of masking material, a material having a lower etching rate than the silicon film in the predetermined etching method can be used.

Another structure of the invention is a method which smooths a surface of a silicon film having depressions and protrusions, comprising the steps of filling depressed portions with a filler and exposing protruding portions among the depressions and protrusions, and removing the protruding portions exposed in the previous step.

In the above structure, as the step of filling the depressed portions among the corrugations with a filler and exposing the protruding portions, the step illustrated in FIG. 3(B) may be cited. In this step, by forming an oxidized silicon film over the corrugations and thereafter removing the oxidized silicon formed on the protruding portions, a state where the protruding portions indicated by 304 are exposed and the oxidized silicon film 303 is left in the depressed portions indicated by 305, i.e. a state where the depressed portions indicated by 305 are filled with the oxidized silicon film 303, is exhibited.

Then after reaching this state, by selectively removing the protruding portions indicated by 304, protrusions in the surface are eliminated (these cannot be completely eliminated as shown in FIG. 4) and a smoothed silicon film can be attained.

Another structure of the invention is a method which smooths a surface of a silicon film having depressions and protrusions, comprising the steps of forming an oxidized silicon film on the surface of the silicon film, and simultaneously removing the oxidized silicon film and the protruding portions of the silicon film.

The above structure achieves a state wherein the oxidized silicon film is formed on the surface of the silicon film having corrugations and these corrugations are sufficiently smoothed, and further, a silicon film having a smooth surface is ultimately achieved by performing etching with an etching method in which the etching rates of the silicon film and oxidized silicon film are sufficiently low. Namely, by forming an oxidized silicon film, after sufficiently smoothing the corrugations in the surface of the silicon film, etching progresses while maintaining the smoothness of the surface and ultimately a silicon film having a smooth surface is obtained by performing etching with a method or under conditions in which the etching rates of the silicon film and oxidized silicon film do not differ.

Concrete examples of the above steps are shown in FIG. 5 and FIG. 6. Firstly, as shown in FIG. 5(A) a silicon film (crystalline silicon film) 107 having corrugations is obtained. Thereafter, as shown in FIG. 5(B) the oxidized silicon film 303 is formed and a state in which the surface is sufficiently smooth is reached. This state can be reached by forming the oxidized silicon film under a formation method or forming conditions in which step coverage is insufficient. Note that where the oxidized silicon film 303 is formed under a formation method or forming conditions in which step coverage is favorable, because film formation progresses with lower corrugations remaining as it is, caution is necessary.

Then, by uniformly promoting etching in the perpendicular direction as shown in FIG. 6(A), the protruding portions and the oxidized silicon film can be etched away simultaneously and ultimately a silicon film 601 having a smooth surface can be obtained (FIG. 6(B)).

This etching step can be performed by using an RIE method utilizing a gas mixture of $CF_4$ and oxygen for example. It is important that in this etching step a method or conditions be selected under which the etching rates of the silicon film and the oxidized silicon film are substantially equal.

Another structure of the invention is a method which smooths a surface of a first silicon film having depressions and protrusions, comprising the steps of forming a second silicon film on the surface of the first silicon film, and removing the first silicon film and second silicon film by performing etching so that the surface obtains a smoothed first silicon film.

In the above structure, by forming a further silicon film (generally an amorphous silicon film) on the surface of the silicon film having corrugations and thereafter by executing etching which is uniform in the direction of the thickness of the film, a smooth silicon film is obtained.

Concrete examples of the above structure will be explained using FIG. 5 and FIG. 6. Firstly, an amorphous silicon film 303 (here 303 indicates an amorphous silicon film) is formed in the surface of the silicon film 107 having corrugations as shown in FIG. 5(A) with a formation method in which step coverage is insufficient. As a result the surface reaches a flat state as shown in FIG. 5(B) Then, as shown in FIG. 6(A), by performing etching using an etching method having anisotropy in the perpendicular direction (e.g. RIE method), etching can be performed uniformly in the perpendicular direction and a silicon film having a smooth surface (smoothed) as shown in FIG. 6(B) can be obtained. In this structure, the silicon film 107 having corrugations and the amorphous silicon film 303 can be made to have a substantially equal etching rate. Consequently, if the smoothness of the amorphous silicon film 303 can be ensured, smoothing of the surface of the silicon film 107 can be reliably realized.

Note that it is necessary to perform etching so that all of the amorphous silicon film 303 (refer to FIG. 5 and FIG. 6) serving as the second silicon film is removed. This is because where the silicon film 107 having corrugations is crystalline, it is preferable for there to be no residual amorphous silicon film 303 on the surface thereof.

By forming an oxidized silicon film whose step coverage is unsatisfactory on the surface of a silicon film having corrugations, removing the thin oxidized silicon film formed on the protruding portions and selectively etching the exposed protruding portions immediately thereafter, a crystalline silicon film whose surface is smoothed can be obtained.

Also, by forming an oxidized silicon film whose step coverage is unsatisfactory on the surface of a silicon film having corrugations in a state where the surface thereof has the necessary flatness, and performing etching with the silicon and the oxidized silicon having the same etching rate, a smoothed silicon film having flatness can be obtained.

Further, by forming an upper silicon film whose step coverage is unsatisfactory on the surface of a silicon film having corrugations in a state where the surface thereof has the necessary flatness and performing further etching, a smoothed silicon film having flatness can be obtained.

By using the smoothed silicon film obtained by utilizing the invention disclosed in the present specification, an thin-film device having excellent electrical characteristics can be obtained without manufacturing difficulties. Also, the invention disclosed in the present specification can be utilized not only for silicon films formed with corrugations due to being irradiated by a laser beam, but for any case generally where a silicon film having corrugations is to be smoothed.

BRIEF DESCRIPTION OF THE DRAWINGS

These and other features, aspects and advantages of the present invention will become better understood with reference to the following description, appended claims and accompaning drawings, wherein:

DETAILED DESCRIPTION OF THE INVENTION

First Embodiment

Figure 1A:
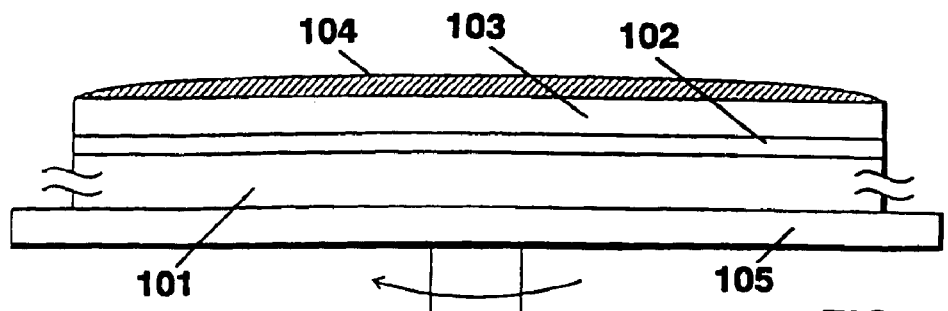
FIGS. 1(A) to 1(C) show fabrication steps for a crystalline silicon film.

The formation step of a crystalline silicon film formed in a glass substrate having a flat surface in the present embodiment will be explained using FIG. 1. Firstly, an oxidized silicon film 102 serving as a lower level film (base film) is deposited on the glass substrate 101 to a thickness of 3000 Å by a sputtering method. Then an amorphous silicon film 103 is deposited to a thickness of 500 Å by a plasma CVD method or a low pressure thermal CVD method.

Next an extremely thin oxidized silicon film (not shown) is formed on the surface of the amorphous silicon film 103 by irradiating it with UV light in an oxidized atmosphere. This oxidized silicon film is for improving wettability of a solution coating the device in a later step.

Then, the film is coated with a solution containing the element nickel which is a metal element for facilitating crystallization of the silicon. Here, a nickel acetate solution containing nickel to a predetermined density is used as the solution containing the element nickel. Then after forming a water film 104 of the nickel acetate solution, spin coating is performed using a spinner 105, the nickel element reaches a state where it is maintained in contact with the surface of the amorphous silicon film 103 (FIG. 1(A)).

Introducing the nickel element makes the average nickel density within the silicon film in its final state $1\times10^{16}$ cm$^{-3}$ to $5\times10^{19}$ cm$^{-3}$. Specifically, the nickel density within the nickel acetate solution is adjusted so that the average nickel density within the silicon film in its final state (state where a crystalline silicon film is attained) becomes the above-described density. Note that the value of this density may be a value measured by a SIMS (secondary ion mass spectrometer).

If the nickel density in the silicon film is $1\times10^{16}$ cm$^{-3}$ or less, the effect of facilitating crystallization cannot be achieved and if the nickel density in the silicon film is $5\times10^{19}$ cm$^{-3}$ or more, the characteristic of the obtained silicon film as a semiconductor will be lost (a characteristic as a metal will appear), therefore caution is necessary.

Figure 1B:
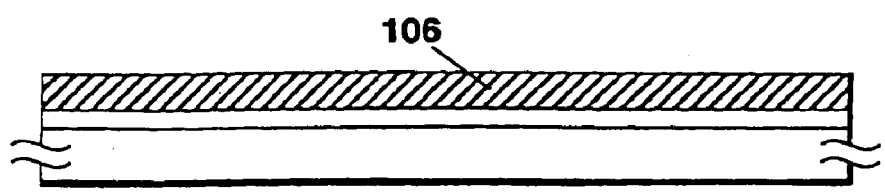

When a state where the nickel element is maintained in the surface of the amorphous silicon film is obtained, thermal processing is performed as shown in FIG. 1(B). A crystalline silicon film 106 can be attained by this thermal processing. Here, this thermal processing is performed in a nitrogen atmosphere. The conditions for thermal processing are 550° C. for 4 hours.

This thermal processing can be performed at a temperature of 450° C. or more. However, at temperatures in the order of 450° C. to 500° C., since even though the amorphous silicon film is crystallized it takes some tens of hours to perform, it is preferable to perform it at a temperature of about 550° C. Also, although crystallization can be achieved in less time if thermal processing is performed at a temperature of more than 550° C., when considering deformation, shrinkage, etc. of the glass substrate due to heating, thermal processing at a temperature of approximately 550° C. or less is preferable.

Figure 1C:
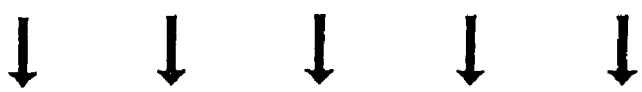
Figure 1C:
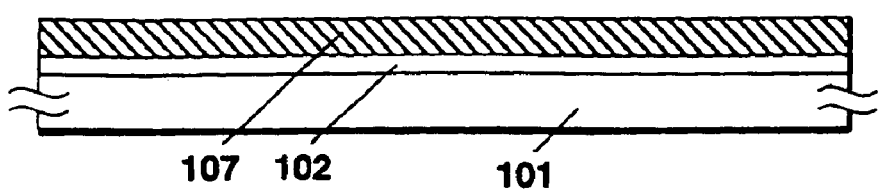

The crystalline silicon film 106 obtained by thermal processing as shown in FIG. 1(B) has not attained sufficiently crystallization and is unsuitable to be used in an active layer of a thin-film transistor as it is. Thus, the crystallinity of the silicon film is further improved by irradiating it with a laser beam as shown in FIG. 1(C). Here, since the thickness of the crystalline silicon film 106 is about 500 Å (slightly shrunk by thermal processing), the energy of radiated laser beam is effectively absorbed in the silicon film (especially in the vicinity of the surface). Then a crystalline silicon film 107 can be attained in a state where crystallization has been further facilitated.

Figure 2:
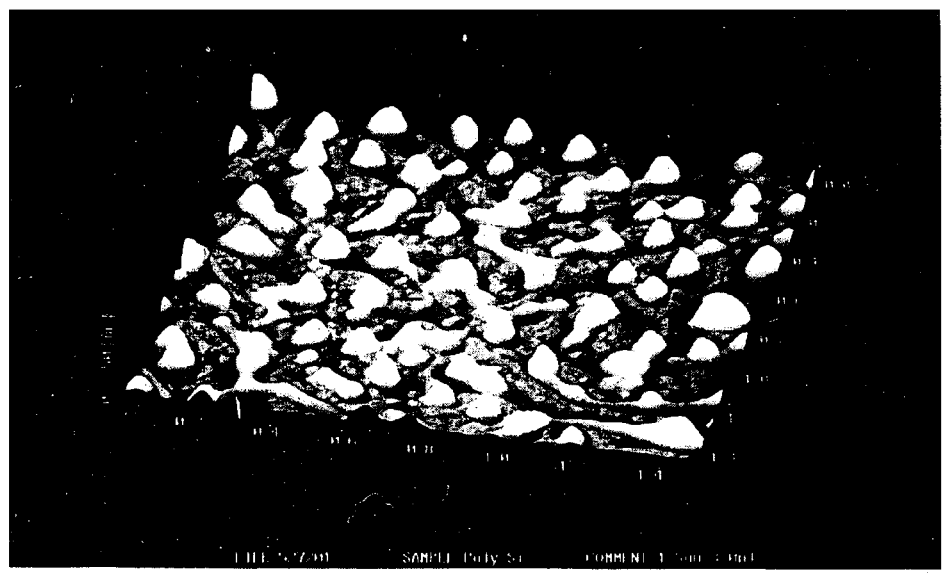
FIG. 2 shows a thin-film of silicon irradiated by a laser beam.

The crystalline silicon film 107 obtained in the step shown in FIG. 1(C) has extremely favorable crystallinity. However, as shown in FIG. 2, the surface thereof has corrugations in the order of several hundreds of angstroms.

Figure 3A:
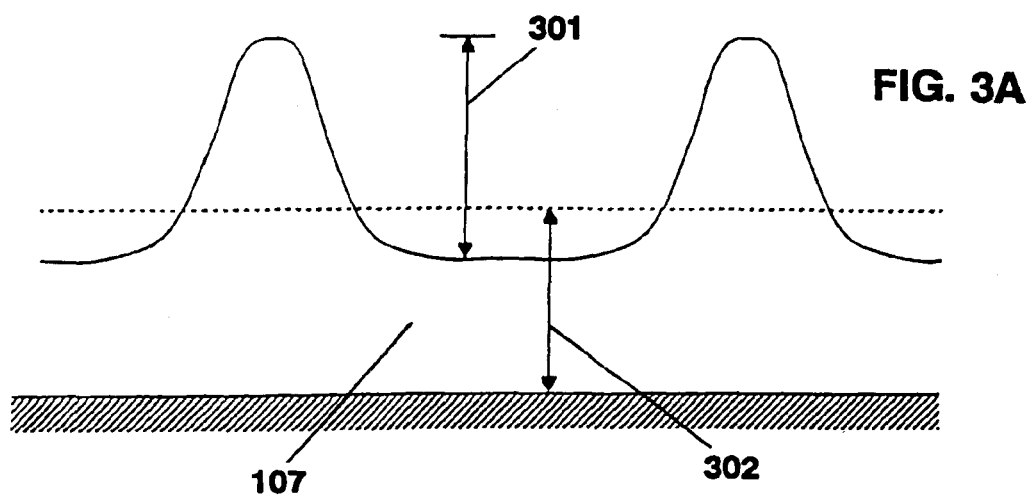
FIGS. 3(A) and 3(B) show steps for smoothing the surface of a silicon film having corrugations.

An enlarged portion of the device in this state is shown in FIG. 3(A). What is shown in FIG. 3(A) is a crystalline silicon film 107 whose average film thickness indicated by 302 is 500 Å, and having corrugations whose height is indicated by 301. The corrugations are formed by irradiation by the laser beam shown in FIG. 1(C). These corrugations are about 100 Å to 600 Å where the film thickness of the starting film (silicon film at the stage prior to laser beam irradiation) is 500 Å.

Next, the oxidized silicon film 303 is deposited to a thickness of 100 Å by a vapor deposition or plasma CVD method. It is necessary for the depositing method and depositing conditions of this oxidized silicon film 303 to be insufficient in step coverage.

In this manner, the oxidized silicon film cannot but be deposited extremely thin on the sides of the protruding portions indicated by 304 due to the step coverage problem. Also, the oxidized silicon film as indicated by 303 is deposited relatively thickly in the lower portions (depressions) of the indented portions indicated by 305 (FIG. 3(B)).

Then etching is performed on the oxidized silicon film using an etchant. Here etching is performed using ammonia fluoride to remove the extremely thin oxidized silicon film deposited on the protruding portions indicated by 304. With this step, although the oxidized silicon film 303 deposited in the indented portions (depressions) indicated by 305 is also somewhat etched, because the thickness of the oxidized silicon film deposited on the protruding portions 304 is extremely thin there is no great problem regarding etching of the oxidized silicon film 303 deposited in the indented portions (depressions) indicated by 305.

Figure 4A:
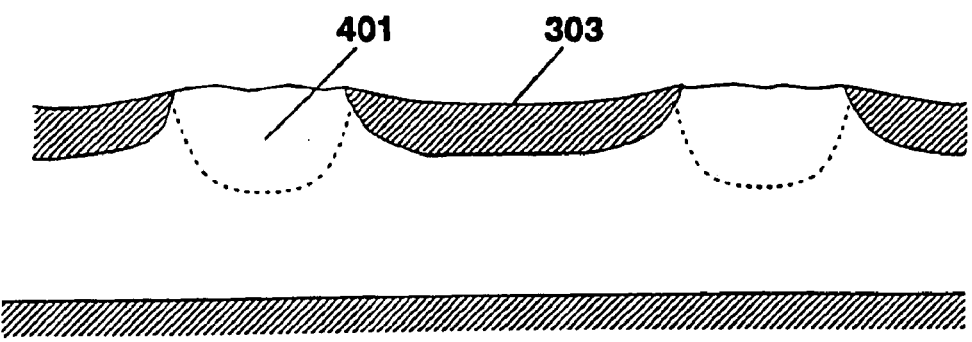
FIGS. 4(A) and 4(B) show steps for smoothing the surface of a silicon film having corrugations.

Thus a state wherein the protruding portions 304 of the crystalline silicon film 107 are exposed is reached. In this state the 303 in the indented portions (depressions) is left behind. Then, by performing etching using an etchant on the silicon, the protruding portions can be selectively removed as shown in FIG. 4(A). At this time, if etching is overdone holes as indicated by 401 will be formed, therefore caution is required.

Hydrazine may be used as the etchant with respect to the silicon as described above. Also one or a number of types of gas selected from among $ClF_3$, $ClF$, $BrF_3$, $IF_3$, $BrF$, $BrF_5$ and $IF_5$ can be used.

Next, by performing etching using an etchant on the oxidized silicon, the oxidized silicon film 303 remaining in the indented portions is etched. Here etching is performed using a buffer hydrofluoric acid as the etchant. Thus a crystalline silicon film 107 whose surface is smoothed to a certain extent as shown in FIG. 4(B) is obtained.

Figure 3B:
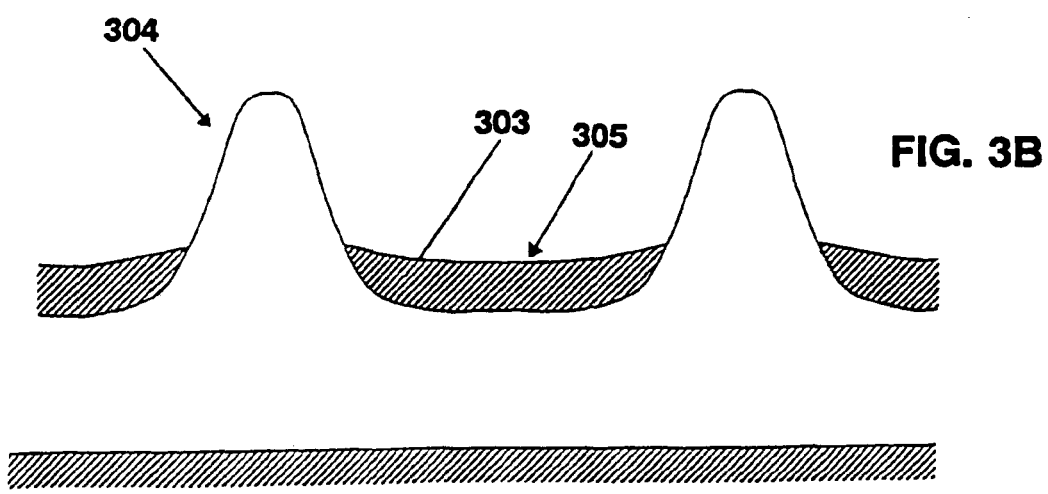
Figure 4B:
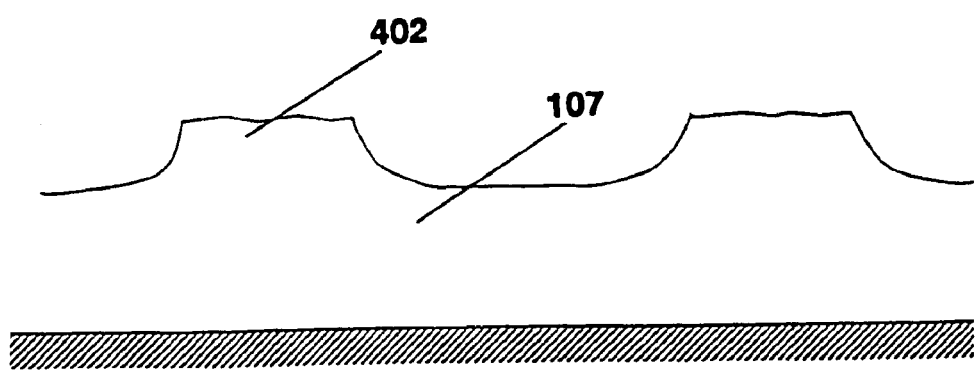

The crystalline silicon film 107 obtained by the steps shown in the present embodiment and shown in FIG. 4(B) still has some protruding portions as indicated by 402. These protruding portions can be reduced in size by thinning as much as possible the thickness of the oxidized silicon film 303 in the step shown in FIG. 3(B). However, the thickness of the oxidized silicon film 303 must be sufficiently thick compared to the thickness of the oxidized silicon film formed in the protruding portions indicated by 304.

In the present embodiment, since the thickness of the oxidized silicon film 303 in the step of FIG. 3(B) is made 100 Å, the difference in height of the corrugations in the surface of the crystalline silicon film 107 shown in FIG. 4(B) can be made about 100 Å. Note that, as shown in the present embodiment, where the protruding portions of the silicon film having corrugations are selectively removed, caution is required as the average film thickness becomes thinner.

Second Embodiment

The present embodiment relates to a structure which achieves a flat crystalline silicon film using dry etching having perpendicular anisotropy. Firstly a crystalline silicon film is obtained on a substrate (glass substrate) having an insulative surface through a step such as that shown in FIG. 1. This crystalline silicon film is formed by being irradiated by a laser beam as shown in FIG. 1(C), therefore the surface thereof has corrugations.

Figure 5A:
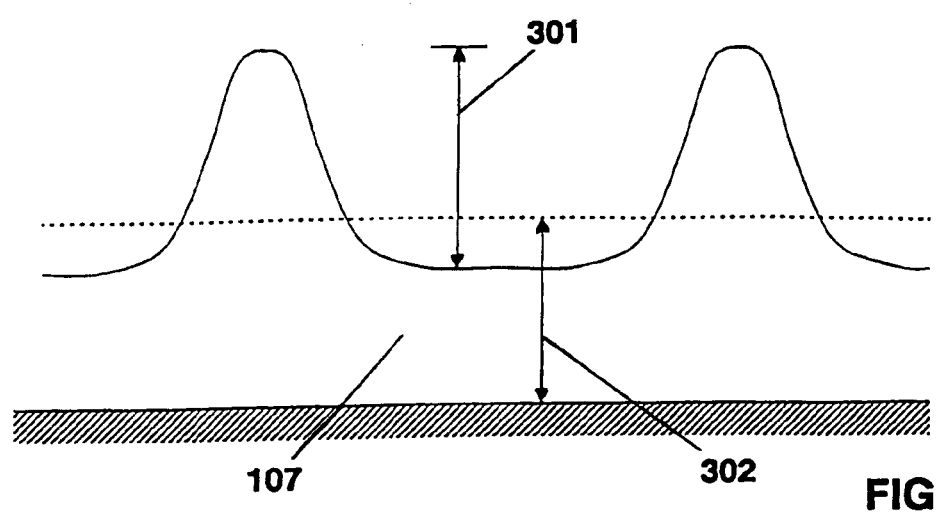
FIGS. 5(A) and 5(B) show steps for smoothing the surface of a silicon film having corrugations.

FIG. 5(A) shows an enlarged view of this state. In FIG. 5(A) the average thickness indicated by 302 and the crystalline silicon film having corrugations having a height difference indicated by 301 are shown. The average thickness indicated by 302 is for example 500 Å, and the height difference of the corrugations indicated by 301 is about 600 to 700 Å for example. As shown in FIG. 5(A), where the thin-film silicon of about 500 Å is irradiated by a laser beam, the height difference indicated by 301 is more than the average film thickness at its largest.

When the crystalline silicon film having the surface condition shown in FIG. 5(A) is obtained, an oxidized silicon film 303 is deposited by a plasma CVD method. It is necessary to deposit the oxidized silicon film 303 thickly enough that the surface thereof is flat. For example, where the height difference indicated by 301 is maximum at 600 to 700 Å or thereabouts, the oxidized silicon film indicated by 303 must be deposited to a thickness of about 3000 Å or more. Also, the deposition method and conditions must incur extremely bad step coverage. Thus the state shown in FIG. 5(B) is reached.

Figure 5B:
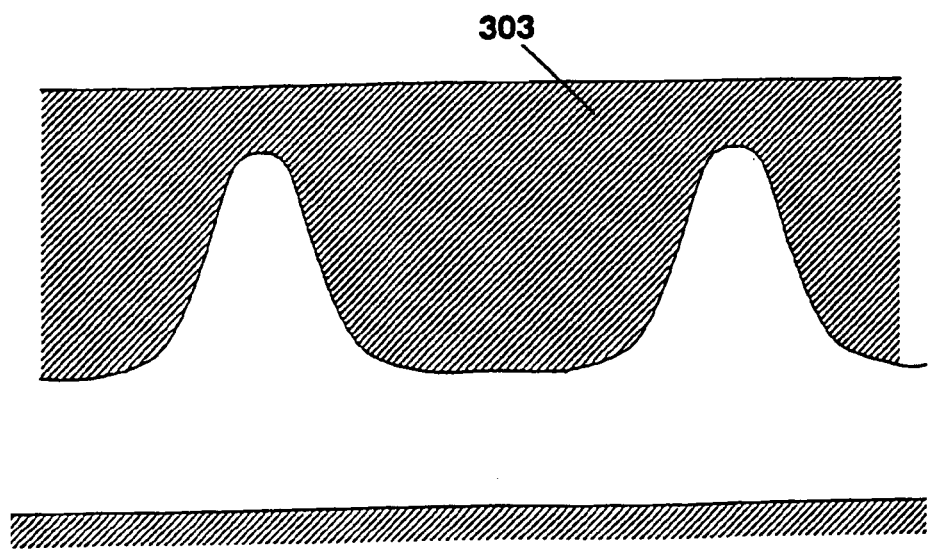
Figure 6A:
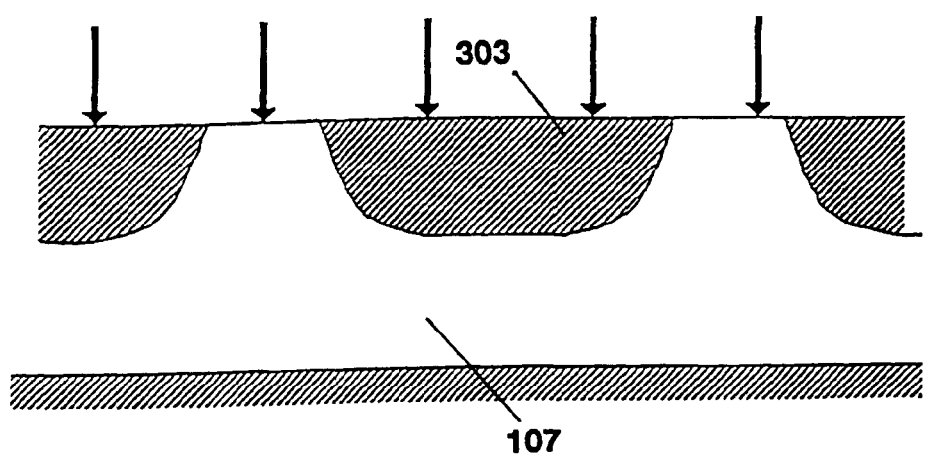
FIGS. 6(A) and 6(B) show steps for smoothing the surface of a silicon film having corrugations.
Figure 6B:
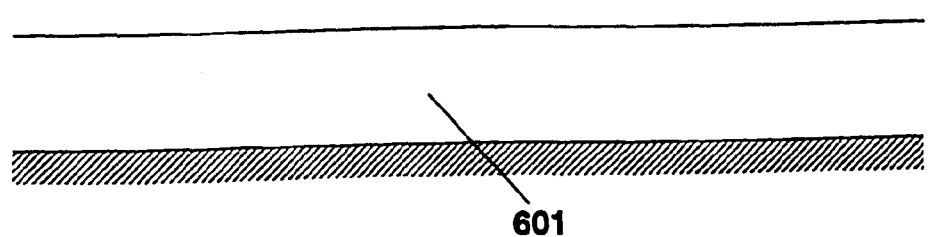

When the state shown in FIG. 5(B) is reached, dry etching is performed by an RIE method using a gas which is a mixture of $CF_4$ and oxygen. The dry etching using a gas which is a mixture of $CF_4$ and oxygen has an etching rate which is roughly the same for both the silicon and the oxidized silicon. Thus etching can be performed while maintaining the flatness of the exposed surface as shown in FIG. 6(A). Then, etching is performed until all of the oxidized silicon film 303 is etched. Thereby, a crystalline silicon film 601 having flatness as shown in FIG. 6(B) can be achieved.

Where the method shown in the present embodiment is utilized, a crystalline silicon film having a substantially flat surface can be attained. However, on the other hand there is a disadvantage in that the conditions for dry etching are delicate.

Third Embodiment

The present embodiment is an example wherein the corrugations in the surface of a silicon film where crystal growth is performed in the surface direction of the film (a direction parallel to the substrate) from a region in which a metal element is introduced by selectively introducing a metal element for promoting crystallization of silicon into an amorphous silicon film are removed.

Firstly, as shown in FIG. 7, an oxidized silicon film 102 is deposited to a thickness of 3000 Å by a sputtering method or plasma CVD method as a lower level film (base film) on a glass substrate 101. Next by means of a plasma CVD method or low pressure thermal CVD method, an amorphous silicon film 103 is deposited to a thickness of 500 Å.

Then this is irradiated by UV light in an oxidized atmosphere to form an extremely thin oxidized film (not shown) on the surface of the amorphous silicon film 103.

Next a resist mask 702 is formed. This resist mask 702 has a structure which exposes the regions indicated by 701. The regions indicated by 701 have a slit shape which has its long side extending along the front side in the drawing and the opposite side to the front side. Then the substrate 101 is arranged on a spinner 105 and coated by a nickel acetate solution containing nickel in a predetermined density, thus forming a water film 703. Then spin coating is performed using the spinner 105.

Figure 7A:
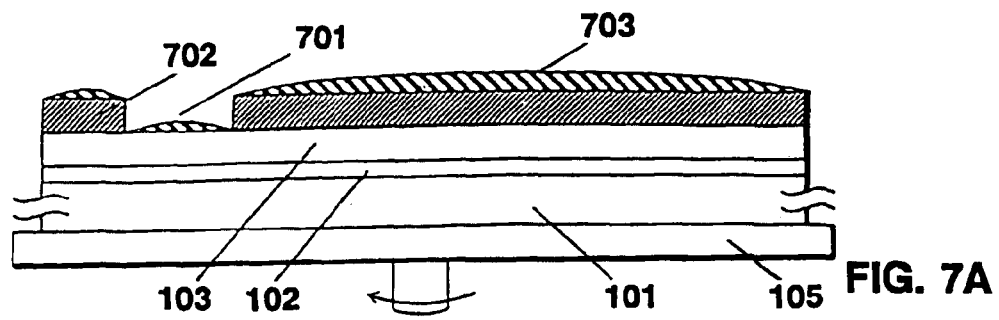
FIGS. 7(A) to 7(D) show fabrication steps for a crystalline silicon film.
Figure 7B:
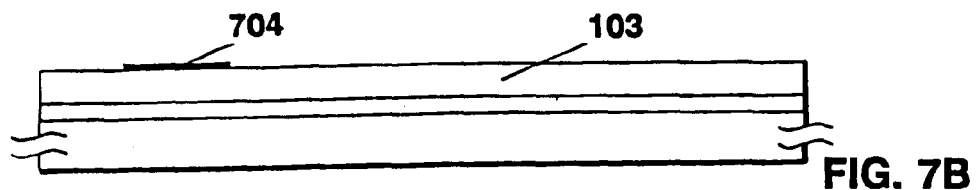

Subsequently, the resist mask 702 is removed and the state shown in FIG. 7(B) is reached. In this state, nickel is introduced into the regions indicated by 701 (the surface of the amorphous silicon film 103 exposed in slit shapes). In this state the nickel reaches an extremely thin film state as indicated by 704 or a state where it is maintained in contact with the amorphous silicon film 103 in a diffused state.

Then thermal processing is performed for 4 hours at 550° C. in a nitrogen atmosphere to crystallize the amorphous silicon film 103. In this thermal processing, as shown by the arrow 705 in FIG. 7(C), crystal growth is carried out in a direction parallel to the substrate 101 from the regions where the nickel indicated by 701 is introduced. This crystal growth can be performed from several tens of $\mu$m to 100 $\mu$m or more.

This crystal growth in the direction parallel to the substrate and indicated by the arrow 705 advances in a pin or column shape. Also, that amorphous components remain in gaps where crystal growth occurs in pin or column shapes is clear from observation by a TEM (transparent electron microscope).

Figure 7C:
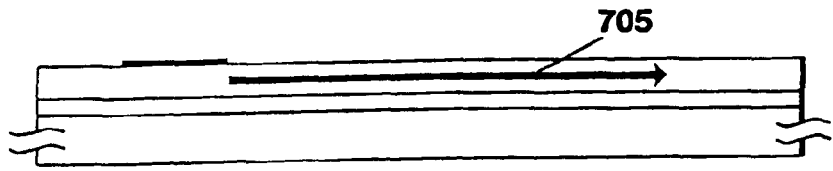
Figure 7D:
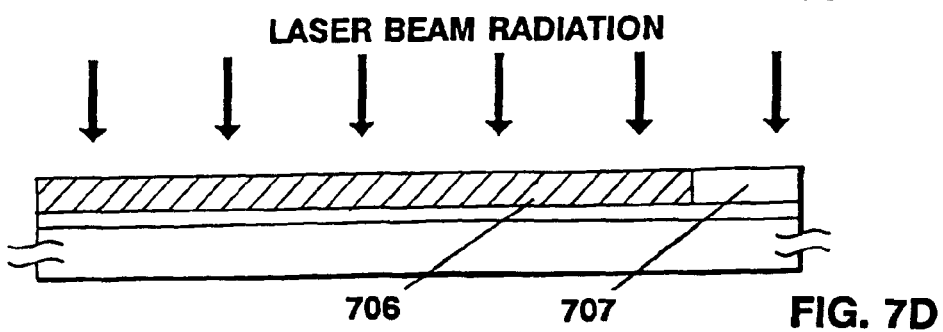

After the crystal growth shown in FIG. 7(C) is performed, this is irradiated by a laser beam (KrF excimer laser) as shown in FIG. 7(D) to further promote crystallization of the silicon film. Thus a region 706 which particularly promotes crystallinity by laser beam irradiation is obtained as shown in FIG. 7(D). Note that the region indicated by 707 is a region in which crystal growth indicated by 705 has not occurred (region beyond the region 705 of the crystal growth) in the thermal processing step shown in FIG. 7(C). Note that this region is crystallized by laser beam irradiation in the step shown in FIG. 7(D) (crystal growth also being advanced solely by laser beam irradiation).

The surface of the thus-obtained crystalline silicon film has similar corrugations to those shown in FIG. 2. These corrugations are formed in all regions irradiated by a laser beam. Namely, the surface of the obtained crystalline silicon film has a shape such as is shown in FIG. 3(A) or FIG. 5(A). Also, by passing through the steps shown in FIG. 3 and FIG. 4 or the steps shown in FIG. 5 and FIG. 6, a crystalline silicon film having a smooth surface can be attained.

Fourth Embodiment

Figure 8A:
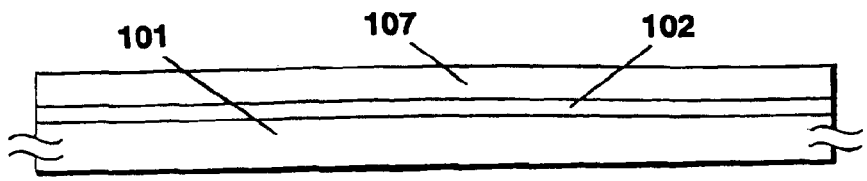
FIGS. 8(A) to 8(D) show fabrication steps for a thin-film transistor.

The present embodiment relates to a structure for obtaining a thin-film transistor using the crystalline silicon film whose surface is smoothed which is obtained in the first embodiment or the second embodiment. Firstly a crystalline silicon film 107 with a substantially flat surface is formed on the glass substrate 101 by the method disclosed in the first embodiment. According to the method shown in the first embodiment a crystalline silicon film in which the height difference of corrugations in the surface is 100 Å or less can be obtained (FIG. 8(A)).

Figure 8B:
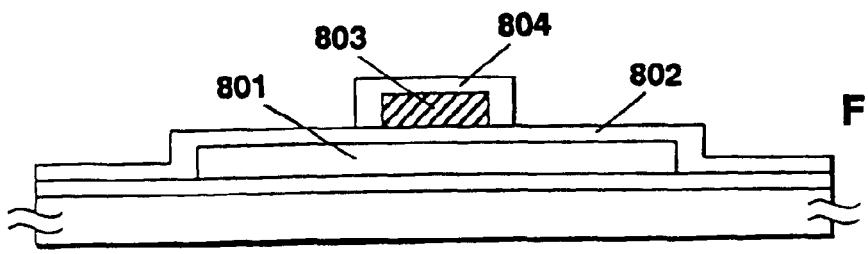

Next the crystalline silicon film 107 is patterned, to form an active layer 801 of the thin-film transistor. Then an oxidized silicon film 802 which serves as a gate insulation film is deposited by a plasma CVD method to a thickness of 1000 Å. Further, a film having aluminum as the main component and containing a small amount of scandium is deposited to a thickness of 6000 Å by an electron beam vapor deposition method. Then the film having aluminum as the main component is patterned to form a gate electrode 803. Thereafter, by performing anode oxidation with the gate electrode 803 as an anode in an electrolyte solution, an oxide layer 804 is formed to a thickness of 2000 Å (FIG. 8(B)).

Figure 8C:
Figure 8C:
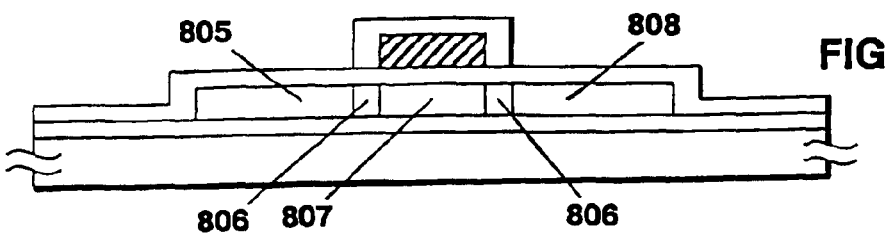

Subsequently, injection of ion impurities is performed to form source and drain regions. Here injection of phosphorus ions is performed to form an N-channel thin-film transistor. In this step phosphorus ions are injected into the regions indicated, by 805 and 808. Then by irradiating them with a laser beam, recrystallization (the surface is decrystallized by injection of the ion impurities) and activation of the injected ion impurities are performed. Thus a self-aligned source region 805 and drain region 808, and further an offset gate region 806 and channel forming region 807 can be formed (FIG. 8(C)).

Next, an oxidized silicon film 809 serving as an interlayer insulation film is deposited by a plasma CVD method to a thickness of 7000 Å. Then contact holes are formed and a source electrode 810 and drain electrode 811 are formed with a material whose main component is aluminum. Finally, by performing a hydrogenation process in a hydrogen atmosphere at 350° C., the thin-film transistor shown in FIG. 8(D) is completed.

Figure 8D:
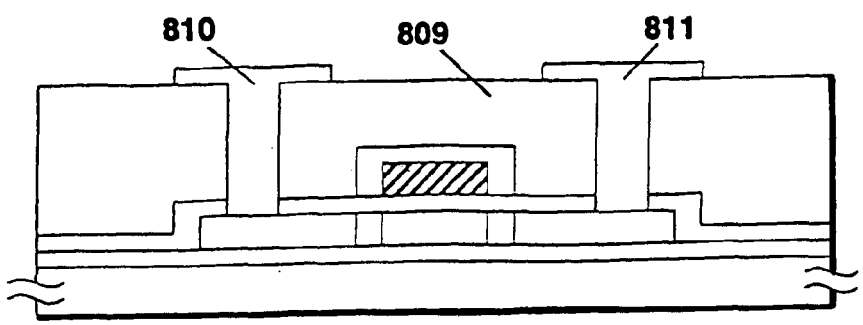

In the thin-film transistor shown in FIG. 8(D), carriers are conducted in the surface of the channel forming region 807 (surface of the plane contacting the gate insulation film 802) between the source 805 and drain 808. Consequently, improvement of the smoothness of the surface of the channel forming region 807 is effective. Namely, by ensuring the smoothness thereof, the effect of dispersion and trapping of carriers when the conducting carriers move can be reduced. Also, improvement of the characteristic of the thin-film transistor can be devised.

Fifth Embodiment

The present embodiment relates to a structure for obtaining a thin-film transistor using a region in which crystal growth occurs in a direction parallel to the substrate obtained in the third embodiment. The thin-film transistor shown in the present embodiment, by having the source and drain regions disposed in the direction of crystal growth parallel to the substrate, can be made so that carriers move along the crystal grain boundary and can attain a large degree of movement.

Sixth Embodiment

The present embodiment is an example in which, in the steps of the first embodiment, a crystalline silicon film is attained not by performing the step shown in FIG. 1(B), but by performing crystallization of an amorphous silicon film solely by laser beam irradiation as shown in FIG. 1(C). Where a thin amorphous silicon film of about 500 Å as in the case of the first embodiment is irradiated by a laser beam, a silicon film which is crystallized or promotes crystallinity can be attained, but the surface thereof has corrugations as shown in FIG. 2.

In the present embodiment, by irradiating the amorphous silicon film with a laser beam, a crystalline silicon film having a surface such as that shown in FIG. 2 is obtained, and by further passing through the steps shown in FIG. 3, is characterized by obtaining a crystalline silicon film whose surface has been smoothed.

Seventh Embodiment

The present embodiment is an example using an amorphous silicon film as the film indicated by 303 in the structure of the embodiment shown in FIG. 5. In this case, the etching rates of the crystalline silicon film 107 having corrugations and the amorphous silicon film 303 do not differ significantly, therefore the dry etching step shown in FIG. 6(A) can be performed relatively easily.

The amorphous silicon film may be one deposited by a plasma CVD method or low pressure thermal CVD method. Also, since the depressions among the corrugations are filled with the amorphous silicon film and obtaining a smooth surface as shown in FIG. 5(B) is preferred, deposition of the amorphous silicon film 303 is preferably performed by a deposition method or under deposition conditions in which step coverage is unsatisfactory. Also, in order for the etching rate of the oxidized silicon film 303 and the etching rate of the crystalline silicon film 107 to match, adding impurities to the amorphous silicon film 303 is effective.

After depositing the amorphous silicon film 303, dry etching is performed by an RIE method using a gas which is a mixture of $CF_4$ and oxygen as the etching gas (FIG. 6(A)).

In this dry etching step, the protruding portions of the amorphous silicon film 303 and the crystalline silicon film 107 are etched and a crystalline silicon film 601 having a smooth surface as shown in FIG. 6(B) can be obtained. In this dry etching step it is necessary to perform the etching so that the amorphous silicon film 303 does not remain.

Eighth Embodiment

The present embodiment is an example where the etching as shown in FIG. 6(A) is performed using a CMP method. CMP is an abbreviation for chemical-mechanical polishing.

Where CMP is used etching having a high level of smoothness can be performed. Consequently, this is an effective means for performing etching which supports smoothness as shown in FIG. 6(A).

What is claimed is:

1. A fabrication method for a thin-film semiconductor device comprising:

forming a semiconductor film comprising silicon to become a source region, a drain region, and a channel forming region located between the source region and the drain region, the semiconductor film formed over a substrate;

crystallizing the semiconductor film by irradiating laser light to the semiconductor film;

forming a silicon oxide film on depressions and protrusions of the semiconductor film;

first etching the silicon oxide film formed on the protrusions of the semiconductor film to expose at least part of the protrusions of the semiconductor film and to leave behind a part of the silicon oxide film located on at least the depressions;

second etching the exposed part of the protrusions of the semiconductor film selectively with an etchant; and forming a gate electrode over the etched semiconductor film with an insulating film there between;

wherein, after the first etching, a top surface of the part of the silicon oxide film located on at least the depressions is closer to the substrate than a top surface of the exposed part of the protrusions, wherein the part of the silicon oxide film located on at least the depressions is used as a mask to obtain a smoothed surface of the semiconductor film, wherein a height difference of the smoothed surface of the semiconductor film is 100 Å or less, and wherein an etching rate of the semiconductor film is higher than that of the silicon oxide film with respect to said etchant.

2. The method of claim 1, wherein the etchant is selected from the group consisting of hydrazine and halogen fluoride.

3. The method of claim 1, wherein the semiconductor film has a thickness of 1000 Å or less.

4. The method of claim 1 further comprising thermally crystallizing the semiconductor film using a metal element for promoting crystallization of the semiconductor film.

5. A method for manufacturing a semiconductor device comprising:

forming a semiconductor film over a substrate;

crystallizing said semiconductor film;

filling at least depressions of said semiconductor film with a filler;

first etching to expose at least part of protrusions of said semiconductor film and to leave behind a part of the filler located on at least the depressions; and second etching said protrusions of said semiconductor film selectively using an etchant, wherein, after the first etching, a top surface of the part of the filler located on at least the depressions is closer to the substrate than a top surface of the exposed part of the protrusions, and wherein said filler has a lower etching rate with respect to said semiconductor film.

6. The method of claim 5, wherein said semiconductor film comprises silicon and said filler comprises silicon oxide.

7. The method of claim 5, wherein said filler is used as a mask.

8. The method of claim 5, wherein said etchant is selected from the group consisting of hydrazine and halogen fluoride.

9. The method of claim 5, wherein said semiconductor film has a thickness of 1000 Å or less.

10. A method for manufacturing a semiconductor device comprising:

forming a semiconductor film comprising silicon over a substrate;

irradiating laser light to said semiconductor film to crystallize said semiconductor film;

forming a layer at least on depressions of said semiconductor film;

first etching to remove a part of said layer using a first etchant;

second etching to remove protrusions of said semiconductor film using a second etchant; and forming a gate electrode over the etched semiconductor film with an insulating film there between.

11. The method of claim 10, wherein said layer comprises silicon oxide, has a lower etching rate with respect to said semiconductor film, and is used as a mask.

12. The method of claim 10, wherein said first etchant is ammonia fluoride and said second etchant is selected from the group consisting of hydrazine and halogen fluoride.

13. The method of claim 10, wherein said semiconductor film has a thickness of 1000 Å or less.

14. A method for manufacturing a semiconductor device comprising:

forming a semiconductor film over a substrate;

irradiating laser light to said semiconductor film to crystallize said semiconductor film;

forming a layer on said semiconductor film;

first etching to remove a part of said layer to expose at least part of protrusions of said semiconductor film using a first etchant; and second etching to remove said protrusions using a second etchant, wherein said first etchant is different from said second etchant.

15. The method of claim 14, wherein said semiconductor film comprises silicon and said layer comprises silicon oxide.

16. The method of claim 14, wherein said layer has a lower etching rate with respect to said semiconductor film and is used as a mask.

17. The method of claim 14, wherein said first etchant is ammonia fluoride and second etchant is selected from the group consisting of hydrazine and halogen fluoride.

18. The method of claim 14, wherein said semiconductor film has a thickness of 1000 Å or less.

19. A method for manufacturing a semiconductor device comprising:

forming a semiconductor film over a substrate;

thermally crystallizing said semiconductor film and filling at least depressions of said semiconductor film with a filler;

first etching to expose at least part of protrusions of said semiconductor film and to leave behind a part of the filler located on at least the depressions; and second etching said protrusions of said semiconductor film selectively using an etchant, as a separate operation from said first etching, wherein said filler has a lower etching rate with respect to said semiconductor film, and wherein, after the first etching a top surface of the part of the filler located on at least the depressions is closer to the substrate than a top surface of the exposed part of the protrusions.

20. The method of claim 19, wherein said semiconductor film comprises silicon and said filler comprises silicon oxide.

21. The method of claim 19, wherein said filler is used as a mask.

22. The method of claim 19, wherein said etchant is selected from the group consisting of hydrazine and halogen fluoride.

23. The method of claim 19, wherein said semiconductor film has a thickness of 1000 Å or less.

24. A method for manufacturing a semiconductor device comprising:

forming a semiconductor film comprising silicon over a substrate;

thermally crystallizing said semiconductor film;

irradiating laser light to said semiconductor film to crystallize said semiconductor film;

forming a layer at least on depressions of said semiconductor film;

first etching to remove a part of said layer using a first etchant;

second etching to remove protrusions of said semiconductor film using a second etchant to provide the semiconductor film with a smoothed surface;

forming a gate electrode over the etched semiconductor film with an insulating film there between, and wherein a height difference of the smoothed surface of the semiconductor film is 100 Å or less.

25. The method of claim 24, wherein said layer comprises silicon oxide, has a lower etching rate with respect to said semiconductor film, and is used as a mask.

26. The method of claim 24, wherein said first etchant is ammonia fluoride and said second etchant is selected from the group consisting of hydrazine and halogen fluoride.

27. The method of claim 24, wherein said semiconductor film has a thickness of 1000 Å or less.

28. A method for manufacturing a semiconductor device comprising:

forming a semiconductor film over a substrate;

thermally crystallizing said semiconductor film;

irradiating laser light to said semiconductor film to crystallize said semiconductor film;

forming a layer on said semiconductor film;

first etching to remove a part of said layer to expose at least part of protrusions of said semiconductor film using a first etchant; and second etching to remove said protrusions using a second etchant, wherein said first etchant is different from said second etchant.

29. The method of claim 28, wherein said semiconductor film comprises silicon and said layer comprises silicon oxide.

30. The method of claim 28, wherein said layer has a lower etching rate with respect to said semiconductor film and is used as a mask.

31. The method of claim 28, wherein said first etchant is ammonia fluoride and second etchant is selected from the group consisting of hydrazine and halogen fluoride.

32. The method of claim 28, wherein said semiconductor film has a thickness of 1000 Å or less.

33. The method of claim 19, wherein said semiconductor film is thermally crystallized using a metal element for promoting crystallization of said semiconductor film.

34. The method of claim 24, wherein said semiconductor film is thermally crystallized using a metal element for promoting crystallization of said semiconductor film.

35. The method of claim 28, wherein said semiconductor film is thermally crystallized using a metal element for promoting crystallization of said semiconductor film.

36. A method for manufacturing a semiconductor device comprising:

forming a semiconductor film over a substrate;

crystallizing said semiconductor film;

filling at least depressions of said semiconductor film with a filler;

first etching to expose at least part of protrusions of said semiconductor film and to leave behind a part of the filler located on at least the depressions; and second etching said protrusions of said semiconductor film selectively using an etchant as a separate operation from said first etching, and wherein, after the first etching, a top surface of the part of the filler located on at least the depressions is closer to the substrate than a top surface of the exposed part of the protrusions.

37. The method of claim 36, wherein said semiconductor film comprises silicon and said filler comprises silicon oxide.

38. The method of claim 36, wherein said filler is used as a mask.

39. The method of claim 36, wherein said etchant is selected from the group consisting of hydrazine and halogen fluoride.

40. The method of claim 36, wherein said semiconductor film has a thickness of 1000 Å or less.

41. A method for manufacturing a semiconductor device comprising:

forming a semiconductor film comprising silicon over a substrate;

irradiating laser light to said semiconductor film to crystallize said semiconductor film;

forming a layer at least on depressions of said semiconductor film;

first etching to remove a part of said layer using a first etchant;

second etching to remove protrusions of said semiconductor film using a second etchant to provide the semiconductor film with a smoothed surface, and wherein a height difference of the smoothed surface of the semiconductor film is 100 Å or less.

42. The method of claim 41, wherein said layer comprises silicon oxide, has a lower etching rate with respect to said semiconductor film and is used as a mask.

43. The method of claim 41, wherein said first etchant is ammonia fluoride and said second etchant is selected from the group consisting of hydrazine and halogen fluoride.

44. The method of claim 41, wherein said semiconductor film has a thickness of 1000 Å or less.

45. A method for manufacturing a semiconductor device comprising:

forming a semiconductor film over a substrate;

irradiating laser light o said semiconductor film to crystallize said semiconductor film;

forming a layer on said semiconductor film;

first etching to remove a part of said layer to expose at least part of protrusions of said semiconductor film using a first etchant; and second etching to remove said protrusions using a second etchant.

46. The method of claim 45, wherein said semiconductor film comprises silicon and said layer comprises silicon oxide.

47. The method of claim 45, wherein said layer has a lower etching rate with respect to said semiconductor film and is used as a mask.

48. The method of claim 45, wherein said first etchant is ammonia fluoride and second etchant is selected from the group consisting of hydrazine and halogen fluoride.

49. The method of claim 45, wherein said semiconductor film has a thickness of 1000 Å or less.

* * * * *